(12) United States Patent
Kikushima (10) Patent No.: US 6,762,537 B1
(45) Date of Patent: Jul. 13, 2004

(54) PIEZOELECTRIC DEVICE AND METHOD FOR MANUFACTURE THEREOF

(75) Inventor: Masayuki Kikushima, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/806,934

(22) PCT Filed: Nov. 1, 1999

(86) PCT No.: PCT/JP99/06091

§ 371 (c)(1),
(2), (4) Date: Apr. 6, 2001

(87) PCT Pub. No.: WO00/33455

PCT Pub. Date: Jun. 8, 2000

(30) Foreign Application Priority Data

Dec. 2, 1998 (JP) .......................................... 10-343087
Jan. 28, 1999 (JP) .......................................... 11-020151

(51) Int. Cl.$^7$ .............................................. H01L 41/08
(52) U.S. Cl. .................................. 310/348; 310/313 R
(58) Field of Search ............................ 310/313 R, 344, 310/348

(56) References Cited

U.S. PATENT DOCUMENTS

| | | | | |
|---|---|---|---|---|
| 4,684,843 A | * | 8/1987 | Ohya et al. .............. | 310/344 X |
| 5,405,476 A | * | 4/1995 | Knecht .................... | 310/348 X |
| 5,459,368 A | * | 10/1995 | Onishi et al. ........... | 310/313 R |
| 5,500,628 A | * | 3/1996 | Knecht .................... | 310/348 X |
| 5,949,294 A | * | 9/1999 | Kondo et al. ........... | 310/348 X |
| 6,057,633 A | * | 5/2000 | Inoi et al. ................ | 310/348 X |
| 6,166,476 A | * | 12/2000 | Nakashima et al. ..... | 310/313 R |
| 6,229,249 B1 | * | 5/2001 | Hatanaka et al. ........... | 310/348 |

FOREIGN PATENT DOCUMENTS

| | | |
|---|---|---|
| JP | A-59-208844 | 11/1984 |
| JP | A 4-18732 | 1/1992 |
| JP | U-5-73947 | 10/1993 |
| JP | A 7-297666 | 11/1995 |
| JP | A 8-222606 | 8/1996 |
| JP | A 8-264540 | 10/1996 |
| JP | A 9-148381 | 6/1997 |
| JP | A-9-326420 | 12/1997 |
| JP | A 10-284972 | 10/1998 |
| JP | A 11-186850 | 7/1999 |
| JP | A 11-308052 | 11/1999 |
| JP | A 11-354587 | 12/1999 |

OTHER PUBLICATIONS

H. Yatsuda et al, "Miniaturized SAW Filters Using a Flip–Chip Technique", IEEE Transactions on Ultrasonics, Ferroelectrics, and Frequency Control, vol. 43, No. 1, (Jan. 1996), pp. 125–129.

* cited by examiner

Primary Examiner—Mark Budd
(74) Attorney, Agent, or Firm—Oliff & Berridge, PLC (57) ABSTRACT

An opening is formed in the center of a base on which an input/output electrode pattern is formed. Meanwhile, a plurality of bumps are formed on two opposing sides of an active element surface of the semiconductor integrated circuit so as to mount the semiconductor integrated circuit in the center of the opening. The semiconductor integrated circuit is connected to the electrode pattern on the base through the plurality of bumps by ultrasonic bonding. In this way, a small and thin piezoelectric device which has superior bonding characteristics of the semiconductor integrated circuit and the base, which are subjected to flip-chip bonding, and which endures mechanical shock, thermal stress, etc., can be obtained at reduced cost.

20 Claims, 12 Drawing Sheets

PIEZOELECTRIC DEVICE AND METHOD FOR MANUFACTURE THEREOF

BACKGROUND OF THE INVENTION

1. Field of the Invention

The present invention relates to a piezoelectric device in which a semiconductor integrated circuit and a piezoelectric resonator element are included in a package, and to a method for manufacturing the same.

2. Description of Related Art

In recent years, hard disk drives (HDD), mobile computers, information apparatuses such as IC cards and portable communication apparatuses such as cellular phones, phones for automobiles have undergone dramatic miniaturization. Accordingly, piezoelectric devices such as piezoelectric oscillators, voltage-controlled oscillators (VCXO), temperature-compensated oscillators (TCXO), SAW oscillators, real time clock modules for use in these apparatuses are also required to be smaller and thinner. Also, surface-mounting type piezoelectric devices capable of being mounted on both sides of the circuit board of the device are desired.

An example of a conventional piezoelectric device will be explained using a quartz crystal oscillator shown in structural diagrams of FIGS. 16(A) and 16(B), the quartz crystal oscillator using a semiconductor integrated circuit of single-chip type having an oscillating circuit and an AT-cut quartz crystal resonator as a piezoelectric resonator element.

Figure 16:
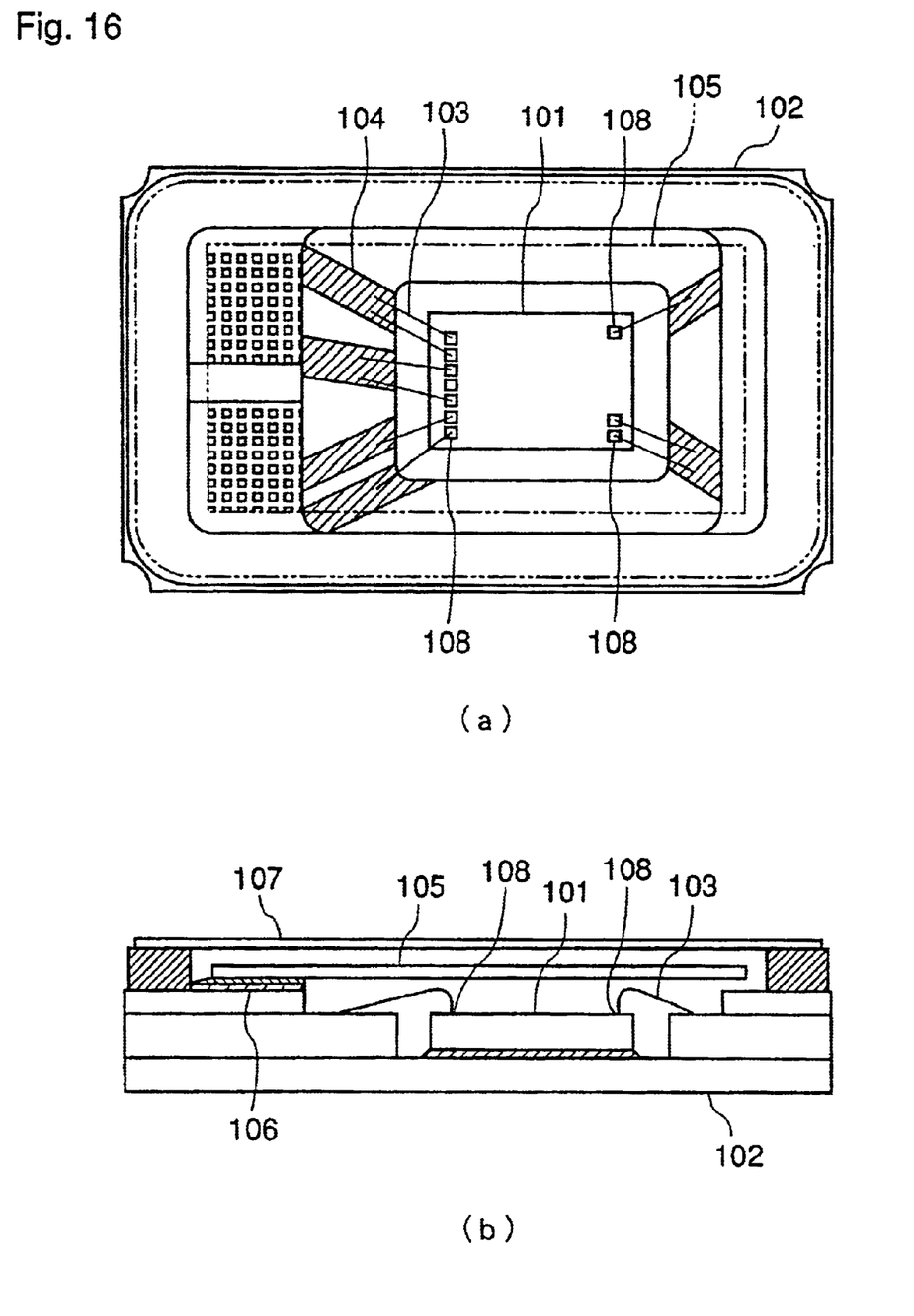
FIGS. 16(A)–(B) are structural diagrams of a conventional piezoelectric device.

In the conventional quartz crystal oscillator in FIGS. 16(A) and 16(B), an IC chip 101 having an oscillating circuit is bonded and fixed by a conductive adhesive, etc., to the bottom face of a base 102 formed of a ceramic insulating substrate, is electrically connected by Au wire-bonding lines 103 to input/output electrodes 104 at the external periphery of the bottom face of the base 102. The input/output electrodes 104 are metallized by metal such as tungsten (W), molybdenum (Mo) and are plated in multiple layers by Ni plating and Au plating, etc. More specifically, a plurality of electrodes 108 are provided in the IC chip 101 and the electrodes 108 are electrically connected to the above-described input/output electrodes 104, etc., by the wire-bonding lines 103.

A rectangular-shaped AT-cut quartz crystal resonator 105 is electrically connected to a mounting portion 106 of the base 102 and is fixed thereto by a conductive adhesive or the like. A plated layer at the top portion of the base 102 and a metallic lid 107 are connected by melting a metallic cladding material such as solder formed on the lid 107 at a high temperature so as to provide a hermetic seal, while maintaining an $N_2$ (nitrogen) atmosphere or to a vacuum atmosphere in the inner portion.

SUMMARY OF THE INVENTION

The above-described conventional quartz crystal oscillator requires an area around the IC chip 101 for wiring the Au wire-bonding lines 103, and a sufficient height in the direction of the package thickness must be secured to accommodate the loops of the Au wire-bonding lines 103. Also, a gap must be provided between the Au wire-bonding lines 103 and the AT-cut quartz crystal resonator 105. Such a configuration prevents further miniaturization of quartz crystal oscillators.

Objects of the present invention are to solve the above-described problems and to provide at reduced cost a small and thin piezoelectric device, such as a quartz crystal oscillator, which can withstand mechanical impacts and has a thickness of 1 mm or less, and to provide a method for manufacturing the piezoelectric device.

One exemplary embodiment of the present invention is a piezoelectric device including a semiconductor integrated circuit and a piezoelectric resonator element both included in a package, wherein an opening is formed in the center of a base provided with an input/output electrode pattern, the semiconductor integrated circuit is mounted in the center of the opening, and the semiconductor integrated circuit is connected to the electrode pattern on the base through a plurality of bumps.

In another exemplary embodiment of the present invention, in the piezoelectric device described above, the plurality of bumps formed on the semiconductor integrated circuit are formed at regular intervals on the center portion of an active element surface of the semiconductor integrated circuit.

In another exemplary embodiment of the present invention, in the piezoelectric device described above, the plurality of bumps formed on the semiconductor integrated circuit are concentrically formed about the center of an active element surface of the semiconductor integrated circuit.

In another exemplary embodiment of the present invention, in the piezoelectric device described above, a dummy bump is formed on the active element surface of the semiconductor integrated circuit.

In another exemplary embodiment of the present invention in the piezoelectric device described above, the dummy bump formed on the semiconductor integrated circuit is connected to the electrode pattern on the base.

In another exemplary embodiment of the present invention, the piezoelectric device described above further includes a layered part, which surrounds the semiconductor integrated circuit, for mounting the piezoelectric resonator, the layered part including at least two layers, including a first layer and a second layer, wherein an opening of the first layer is formed to be larger than an opening of the second layer.

In another exemplary embodiment of the present invention, in the piezoelectric device described above, each of the plurality of bumps formed on the semiconductor integrated circuit is shaped to have two levels, one having a diameter 0.8 to 0.9 times and the other having a diameter 0.4 to 0.45 times the length of a side of an opening in a pad provided on an active element surface of the semiconductor integrated circuit.

In another exemplary embodiment of the present invention, in the piezoelectric device described above, the base may consist of a ceramic composite substrate.

In another exemplary embodiment of the present invention, in the piezoelectric device described above, each of the plurality of bumps formed on the semiconductor integrated circuit is an Au bump.

In another exemplary embodiment of the present invention, in the piezoelectric device described above, a protrusion is formed in at least one side wall of the base facing the side of the semiconductor integrated circuit.

In another exemplary embodiment of the present invention, in the piezoelectric device described above, the protrusion is formed in each of the side walls of the base facing the two sides along the longitudinal direction of the semiconductor integrated circuit.

In another exemplary embodiment of the present invention, in the piezoelectric device described above, the protrusion formed in the side wall of the base has substantially the same height as, or is higher than, the semiconductor integrated circuit.

In another exemplary embodiment of the present invention, in the piezoelectric device described above, a gap between the protrusion formed in the side wall of the base and the semiconductor integrated circuit is set to a range between 0.05 and 0.15 mm.

Another exemplary embodiment of the present invention is a piezoelectric, device including a semiconductor integrated circuit and a piezoelectric resonator element included in a package, wherein an opening is formed in the center of a base provided with an input/output electrode pattern, a plurality of bumps are formed at two opposing sides of an active element surface of the semiconductor integrated circuit, the semiconductor integrated circuit is mounted in the opening, and the semiconductor integrated circuit is connected to the electrode pattern of the base through the plurality of bumps.

In another exemplary embodiment of the present invention, in the piezoelectric device described above, the plurality of bumps formed on the semiconductor integrated circuit are formed at regular intervals at the center portion of the active element surface of the semiconductor integrated circuit.

In another exemplary embodiment of the present invention, in the piezoelectric device described above, a dummy bump is formed on the active element surface of the semiconductor integrated circuit.

In another exemplary embodiment of the present invention, in the piezoelectric device described above, the dummy bump formed on the semiconductor integrated circuit is connected to the electrode pattern on the base.

In another exemplary embodiment of the present invention, the piezoelectric device described above, further includes a layered part on which the piezoelectric resonator is mounted and which surrounds the semiconductor integrated circuit, the layered part including at least two layers including a first layer and a second layer, wherein an opening of the first layer is formed to be larger than an opening of the second layer.

In another exemplary embodiment of the present invention, in the piezoelectric device described above, each of the plurality of bumps formed on the semiconductor integrated circuit is shaped to have two levels, one having a diameter 0.8 to 0.9 times and the other having a diameter 0.4 to 0.45 times the length of an opening in a pad provided on the active element surface of the semiconductor integrated circuit.

In another exemplary embodiment of the present invention, in the piezoelectric device described above, the base includes a ceramic composite substrate.

In another exemplary embodiment of the present invention, in the piezoelectric device described above, the plurality of bumps formed on the semiconductor integrated circuit are Au bumps.

Another exemplary embodiment of the present invention is a piezoelectric device including a semiconductor integrated circuit and a piezoelectric resonator element included in a package, wherein an opening is formed in the center of a base provided with an input/output electrode pattern is formed, a plurality of bumps are formed at two opposing sides of an active element surface of the semiconductor integrated circuit, the semiconductor integrated circuit is mounted in the center of the opening, and the semiconductor integrated circuit is connected to the electrode pattern through the plurality of bumps by ultrasonic bonding.

In another exemplary embodiment of the present invention, in the piezoelectric device described above, a vibration direction of ultrasonic waves applied to the semiconductor integrated circuit is perpendicular to the two opposing sides of the active element surface of the semiconductor integrated circuit at which the plurality of bumps are formed.

In another exemplary embodiment of the present invention, in the piezoelectric device described above, a printing direction of the electrode pattern on the base and a vibration direction of ultrasonic waves applied to the semiconductor integrated circuit are the same.

In another exemplary embodiment of the present invention, in the piezoelectric device described above, each of the plurality of bumps formed on the semiconductor integrated circuit is shaped to have two levels, one having a diameter 0.8 to 0.9 times and the other having a diameter 0.4 to 0.45 times the length of an opening in a pad provided on the active element surface of the semiconductor integrated circuit.

In another exemplary embodiment of the present invention, in the piezoelectric device described above, each of the plurality of bumps formed on the semiconductor integrated circuit is shaped to have two levels, one being 80 to 90 $\mu$m in diameter and 30 to 35 $\mu$m in height, and the other being 40 to 45 $\mu$m in diameter and 30 to 35 $\mu$m in height.

In another exemplary embodiment of the present invention, in the piezoelectric device described above, the base consists of a ceramic composite substrate.

In another exemplary embodiment of the present invention, in the piezoelectric device described above, the plurality of bumps formed On the semiconductor integrated circuit are Au bumps.

In another exemplary embodiment of the present invention, in the piezoelectric device described above, the longitudinal direction of the electrode pattern on the base and a vibration direction of-ultrasonic waves applied to the semiconductor integrated circuit are the same.

In another exemplary embodiment of the present invention, the piezoelectric device described above includes the semiconductor integrated circuit and the piezoelectric resonator element in included in the package, wherein a vibration direction of ultrasonic waves for ultrasonic bonding and for forming bumps on the semiconductor integrated circuit and a vibration direction of ultrasonic waves for performing ultrasonic bonding of the semiconductor integrated circuit to the package are different from each other.

Another exemplary embodiment of the present invention is a method for manufacturing a piezoelectric device including a semiconductor integrated circuit and a piezoelectric resonator element included in a package, the method may include: a step of forming a metallic bump on the semiconductor integrated circuit; a step of connecting the semiconductor integrated circuit on which the metallic bump is formed to the base by ultrasonic bonding; a step of detecting a height direction of the semiconductor integrated circuit during the ultrasonic bonding; a step of mounting the piezoelectric resonator element; and a step of hermetically sealing a metallic lid to the base.

Another exemplary embodiment of the present invention is a method for r manufacturing a piezoelectric device including a semiconductor integrated circuit and a piezoelectric resonator element included in a package, the method may include: a step of forming a metallic bump on the semiconductor integrated circuit; a step of connecting the semiconductor integrated circuit on which metallic bump is formed to the base by ultrasonic bonding; a step of detecting a height direction of the semiconductor integrated circuit during the ultrasonic bonding step; a step of filling an underfill material around the semiconductor integrated circuit so as to cover the entire semiconductor integrated circuit including a rear surface of the semiconductor integrated circuit; a step of mounting the piezoelectric resonator element; and a step of hermetically sealing a metallic lid to the base.

DETAILED DESCRIPTION OF PREFERRED EMBODIMENTS

The preferred embodiments of the present inventions will be described below with reference to the drawings.

An embodiment of a piezoelectric device of the present invention is described with reference to the drawings, using as an example a quartz crystal oscillator having a single-chip-type semiconductor integrated circuit having an oscillation circuit and an AT-cut quartz crystal resonator element as a piezoelectric resonator element.

Embodiment 1

Figure 1:
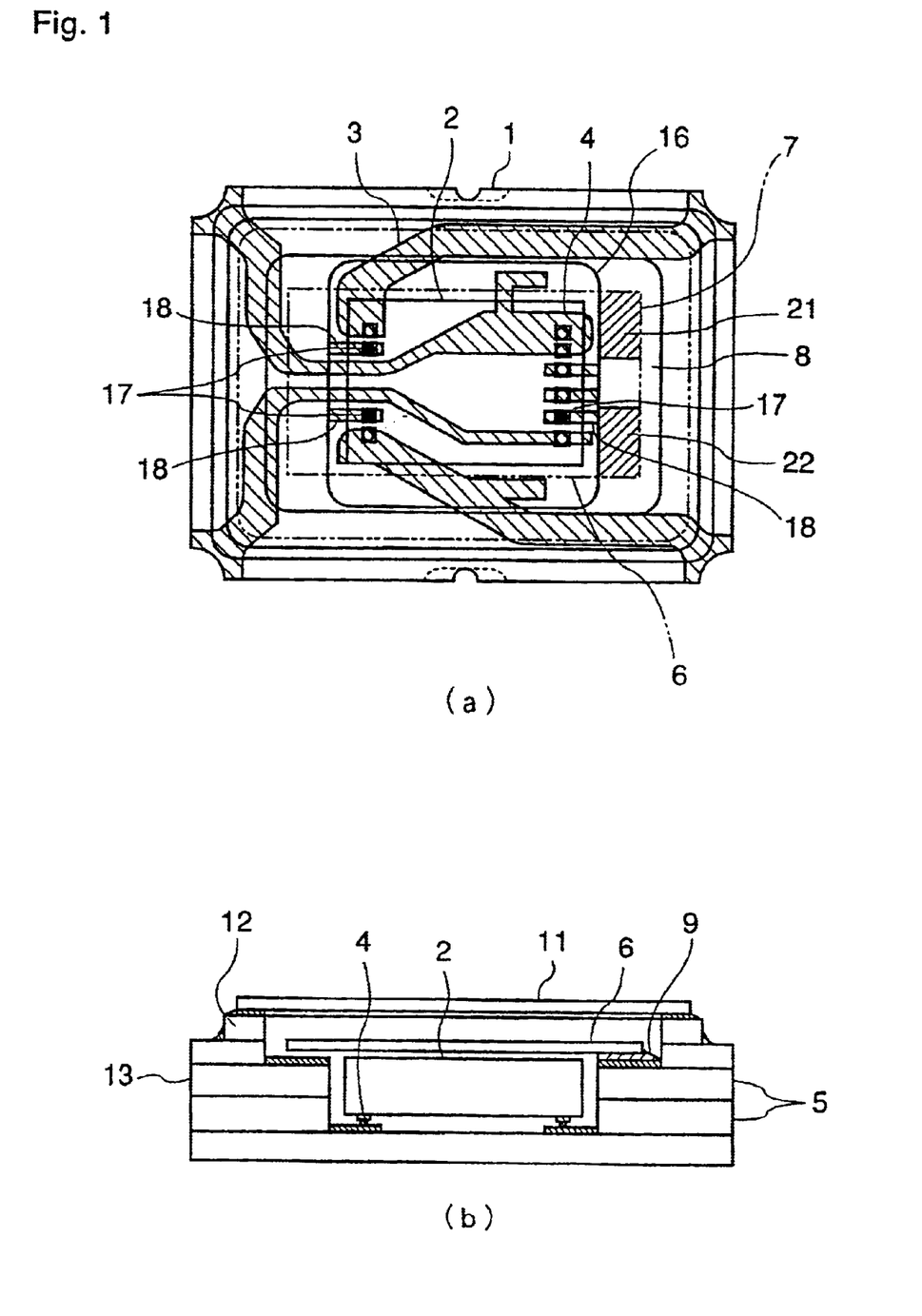
FIGS. 1(A)–(B) are structural diagrams of a piezoelectric device according to the present invention.

FIGS. 1(A)–(B) are structural diagrams of a surface-mount type quartz crystal oscillator according to an embodiment of the present invention.

As shown in a plan view of FIG. 1(A) and in a front view of FIG. 1(B), on a first layer of a base 1 consisting of a ceramic insulating substrate having at least three layers and a seal ring of Fe—Ni alloy or the like, stamped to a frame shape, an electrode pattern 3 for forming a connection with a semiconductor integrated circuit (IC chip: hereinafter referred to as the IC chip) 2 is metallized by means of printing by using metal wiring material such as W (tungsten), Mo (molybdenum). On the top thereof, Ni plating and Au plating, etc., are provided.

On an electrode pad of the IC chip 2, a metallic bump 4 made of Au or the like is formed and, by a flip-chip bonding method, is connected to the electrode pattern 3 formed on the base 1. Among various techniques of the flip-chip bonding method, the method employed in the present embodiment is one using ultrasonic waves to yield an Au—Au solid state bond.

A supported portion 7 of an AT-cut quartz crystal resonator 6 is connected and fixed by a conductive adhesive 9 to a mounting portion 8 provided in a second layer 5 of the base 1.

A metallic lid 11 is aligned with a seal ring 12 formed of an Fe—Ni alloy or the like die-cut into a frame shape, is fixed, and is hermetically sealed by seam welding.

Accordingly, a small and thin surface-mounted package type quartz crystal oscillator 13 is obtained.

Next, a bump forming process for forming the bump 4 made of Au or the like on the IC chip 2, and a flip-chip bonding process for connecting the IC chip Z to the electrode pattern 3 formed on the base 1 will be described in detail.

Figure 2:
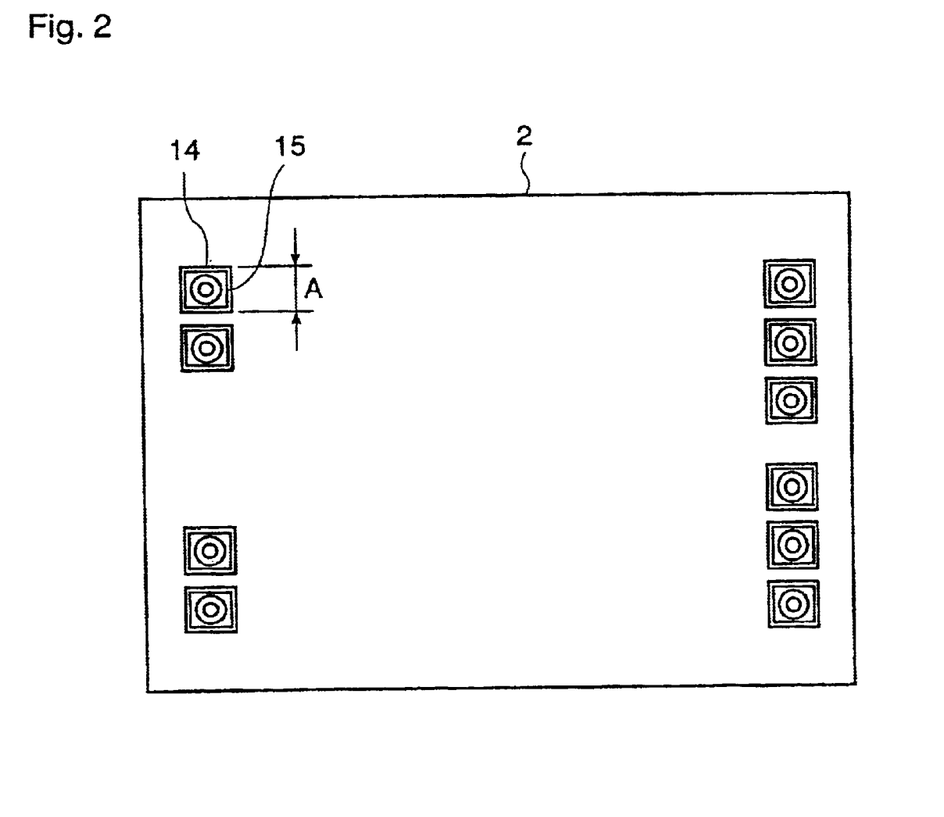
FIG. 2 is a diagram illustrating the formation of a bump on a wafer of the piezoelectric device of the present invention.

For example, as shown in FIG. 2, on pads 14 of the wafer IC chip 2 which is 4 to 6 inches, a plurality of bumps 4 are formed by ultrasonic bump bonding using fine Au bonding lines each having a diameter of, for example, approximately 25 to 35 $\mu$m.

Figure 3:
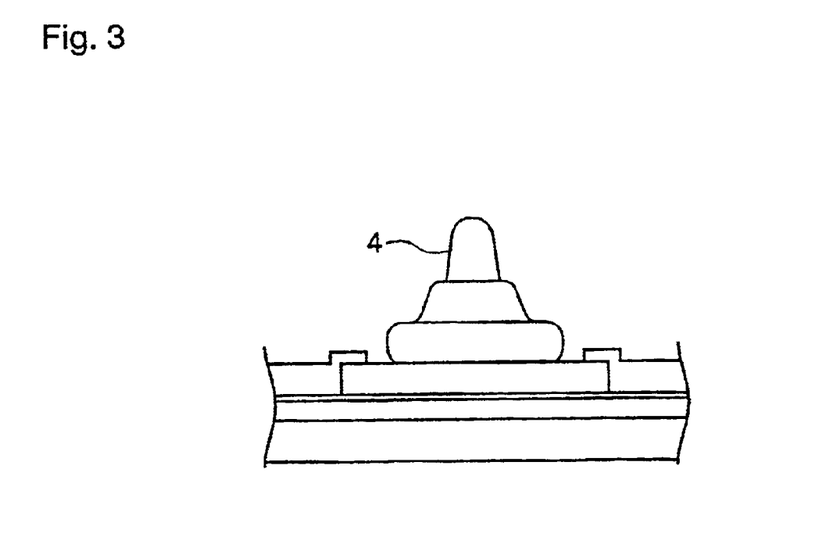
FIG. 3 is a diagram showing the shape of the bump of the piezoelectric device of the present invention.

There are several possible shapes for the bump 4; in this embodiment, as shown in FIG. 3, the bump 4 having two levels is formed.

When a side of a pad opening 15 of the pad 14 of the IC chip 2 has a length A, the bump 4 is shaped to have two levels, one having a diameter of 0.8A to 0.9A, another having a diameter of 0.4A to 0.45A.

Described in terms of specific figures, when the length of one side of the pad opening 15 in the typical pad 14 is 100 $\mu$m, the bump 4 preferably has two levels, one being 80 to 90 $\mu$m in diameter and 30 to 35 $\mu$m in height, the other being 40 to 45 $\mu$m in diameter and 30 to 35 $\mu$m in height.

In order to form bumps on a number of (approximately several thousand) wafer IC chips 2, the working temperature for forming the bumps is preferably low and, in this embodiment, the bumps are worked at a temperature of approximately 180° C. The experiments and evaluations regarding jointing strength and range of eutectic show that the preferable temperature is, for example, a temperature in a range of 180° C. to 230° C.

Figure 4:
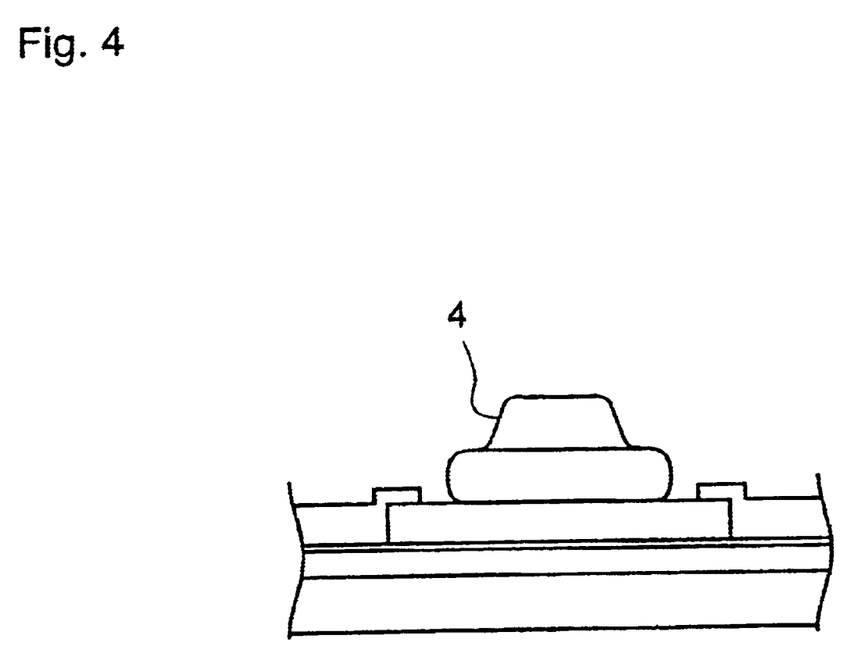
FIG. 4 is a diagram showing the shape of another bump of the piezoelectric device of the present invention.

In order to improve the flatness of the tip portion of the second stage of the bump 4, the tip portion of the bump 4 may be crushed and leveled as shown in FIG. 4.

Next, a flip-chip bonding process for bonding the IC chip 2 provided with the bumps 4 of the above-described shape to the base 1 will be described in detail.

Figure 5:
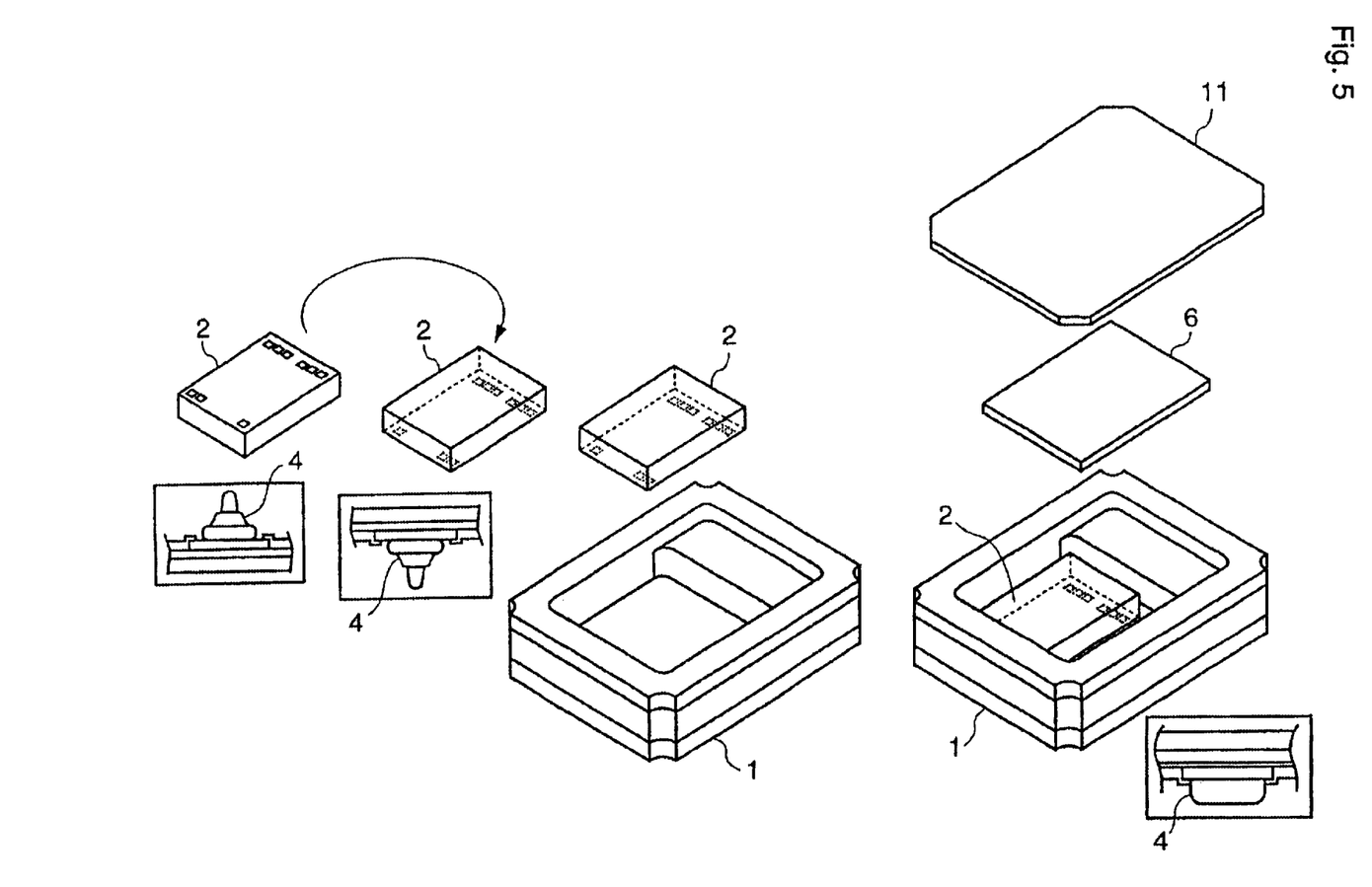
FIG. 5 is a process diagram illustrating a flip-chip bonding process of the present invention.

FIG. 5 is a process diagram illustrating a flip-chip bonding process.

The wafer IC chip 2 is picked up by a nozzle such as an inverted pyramidal collet, is turned over, and is passed on to an nozzle tip of an ultrasonic horn. Then, the IC chip 2 is aligned and is chip-mounted on a mounting area of the base 1 with high precision by a system such as an image recognition system provided in the flip-chip bonding apparatus.

When the IC chip 2 contacts the electrode pattern 3 of the base 1 and load is detected by the flip-chip bonding apparatus, weight is applied at 100 grams per bump and, ultrasonic waves are simultaneously applied to bond Au in the bump 4 and Au in the electrode pattern 3 in a solid state. The conditions of the ultrasonic waves are determined by the power of ultrasonic waves and application period of the ultrasonic waves. In order to conduct the bonding, a proper temperature is required, and the base 1 is preheated at, for example, a temperature in a range between approximately 150° C. and 200° C. The base 1 is also heated in a similar manner during the ultrasonic wave processing.

In the flip-chip bonding apparatus, a sensor for detecting a height direction of the IC chip 2 is provided and by checking and controlling the height data, the process can be carried out as if the height of the bumps 4 were uniform.

The working parameters employed in the present embodiment is to apply load of approximately 100 grams per bump and, for the parameters of the ultrasonic waves, a parameter value determined by the size of the IC chip 2 and the number of the bumps 4 is used.

Figure 6:
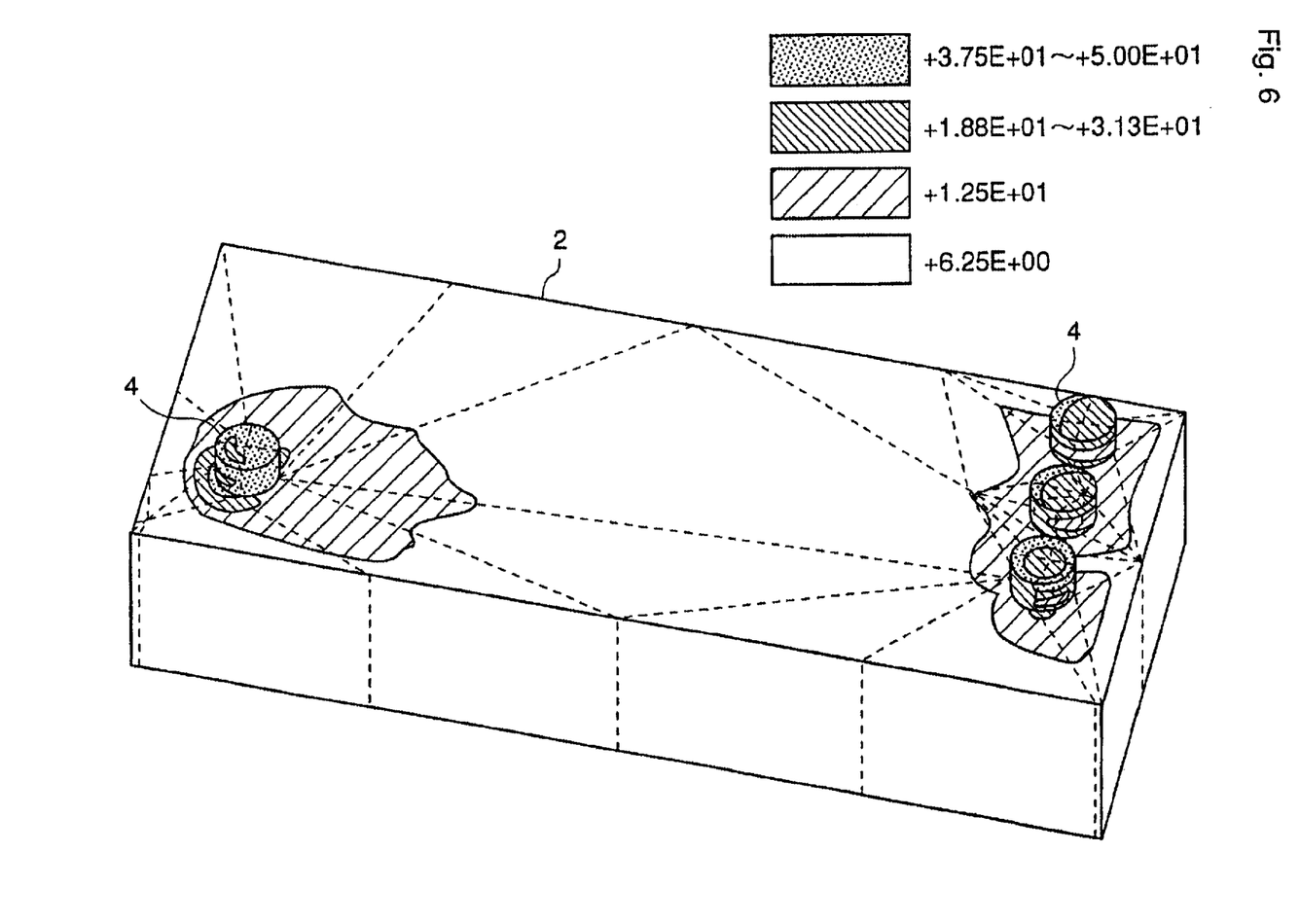
FIG. 6 is a stress distribution map according to FEM analysis.

FIG. 6 is a stress distribution map of the IC chip 2 and the vicinity of the bumps 4 during reflow using FEM (Finite Element Method) analysis or when thermal stress due to a cycling test, etc., is applied to the quartz crystal oscillator 13.

From this stress distribution map, it can be understood that the stress value is varied depending on the position of the bump and that significant stress concentration acts in the vicinities of the bumps 4 arranged at the corners of the IC chip 2 and in the portion with fewer bumps 4.

When the stress is applied to the vicinity of the bumps 4 as described above, a failure such as the bump 4 and the electrode pattern 3 becoming disconnected, is likely to occur. Such failure is likely to occur especially when a high temperature such as that during reflow is suddenly applied to the quartz crystal oscillator 13. Such failure may also occur due to aging, dropping a device such as a portable device having the thin quartz crystal oscillator 13 inside, and mechanical shock such as vibrations.

The thermal stress and mechanical stress due to dropping and vibration are related to the overall structure of the base 1, and it is another object of the present invention to provide a configuration of the quartz crystal oscillator 13 in which stress is not concentrated around the bump 4. Essential points of such a configuration will be described below.

As shown in FIGS. 1(A)–(B), a configuration in which an opening 16 is formed in the center of the base 1 and the IC chip 2 is mounted in the center of the opening 16 is employed. Thus, when the quartz crystal oscillator 13 is exposed to stress, by this configuration, the stress is evenly applied to the IC chip 2, preventing the stress from concentrating in a specific portion.

Next, a configuration in which dummy bumps 17 are formed will be explained. The dummy bumps 17 are connected to an electrode pattern 18 laid out on the base 1. In this embodiment, the electrode pattern 18 is not connected to the input/output electrodes and is configured to be electrically isolated.

By employing the structure with the dummy bumps 17 formed, the arrays of the bumps 4 at two opposing sides become even, equally sharing the stress applied to the vicinity of the bumps 4.

Consequently, in this configuration, stress is not concentrated in a specific area and well-balanced bonding characteristics resistant to thermal stress and mechanical stress can be obtained.

Next, the direction in which ultrasonic waves are applied and deformation of the bumps 4 will be described.

During the process of applying ultrasonic waves to perform solid state bonding of Au in the bump 4 and Au in the electrode pattern 3, the initial two-level shape of the bump 4 shown in FIG. 3 is deformed and connected. At this time, in order to prevent a short-circuit between the adjacent bumps 4 and in order to perform bonding of all the bumps 4 and the electrode pattern 3 in an even manner, the way in which the bumps 4 are arrayed relative to the application direction of the ultrasonic waves, the directions in which the electrode pattern 3 is printed on the base 1, and the direction in which the ultrasonic waves are applied are regulated.

To be specific, the bonding process is carried out in such a manner that the vibration direction of ultrasonic waves applied to the IC chip 2 is substantially perpendicular to the two opposing sides of an active element surface of the IC chip 2 provided with the plurality of the bumps 4.

Figure 13:
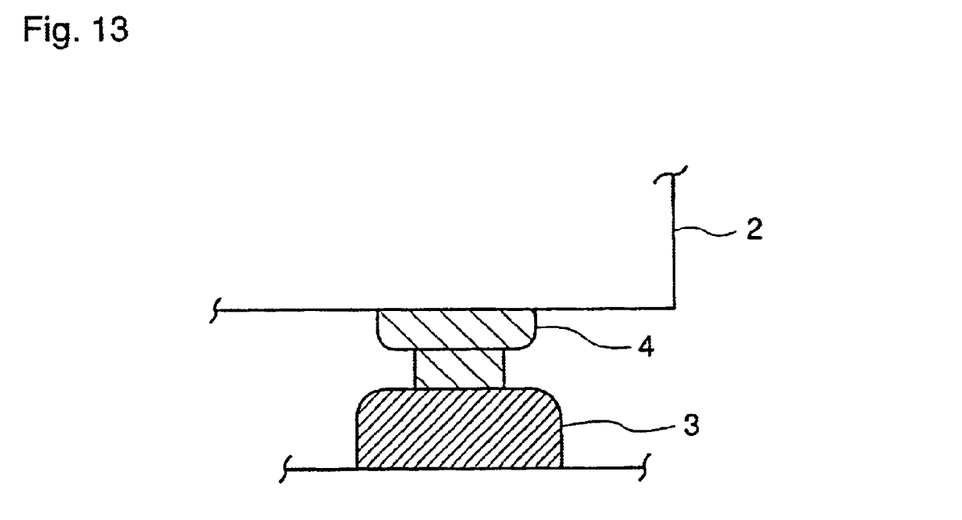
FIG. 13 is a structural diagram showing a cross-section of a bonded portion of the present invention.

FIG. 13 is a sectional view showing the bonded portion of the electrode pattern 3 and the bump 4.

Because the electrode pattern 3 is formed by applying electrode material by thick-film printing, both ends thereof sag, and the bump 4 and the electrode pattern 3 are not bonded at such portions.

Accordingly, when the process is performed by-adjusting the vibration direction of the ultrasonic waves to be perpendicular to the longitudinal direction of the electrode pattern 3, there is a problem in that bonding is not carried out in an even manner and that sufficient jointing force cannot be obtained. Thus, in this embodiment, the bonding process is carried out in such a manner that the vibration direction of the ultrasonic waves applied to the IC chip 2 is set to be the same as the longitudinal direction of the electrode pattern 3 on the base 1 and the printing direction of the electrode pattern 3.

Next, a process for mounting the AT-cut quartz crystal resonator 6 to the base 1 will be explained.

As shown in FIGS. 1(A)–(B), the AT-cut quartz crystal resonator 6 is connected and fixed by the conductive adhesive 9 to mounting electrodes 21 and 22 of the mounting portion 8 provided in the second layer 5 of the base 1.

Then, the entire package including the IC chip 2 and the AT-cut quartz crystal resonator 6 are subjected to an annealing treatment at a high temperature while hardening the conductive adhesive 9. This also has the effect of removing gasses emitted from the conductive adhesive 9, the base 1, and so forth. Generally, the treatment is carried out for 1 to 2 hours at a high temperature in a range between 200° C. and 300° C.

By this thermal treatment, an Al—Au eutectic reaction in the bump 4, an Au—Au solid-state bonding reaction, stress release in the bonded portion, and so forth are promoted, and bonding characteristics such as bonding strength of the bump 4 change. In this embodiment, conditions for forming the bump 4 and conditions for the flip chip bonding are determined taking into consideration such heat history after the flip chip bonding.

Furthermore, the metallic lid 11 is aligned with the seal ring 12 of Fe—Ni alloy or the like, which is stamped into a frame shape, on the base 1, and is hermetically sealed by seam welding.

Embodiment 2

Figure 7:
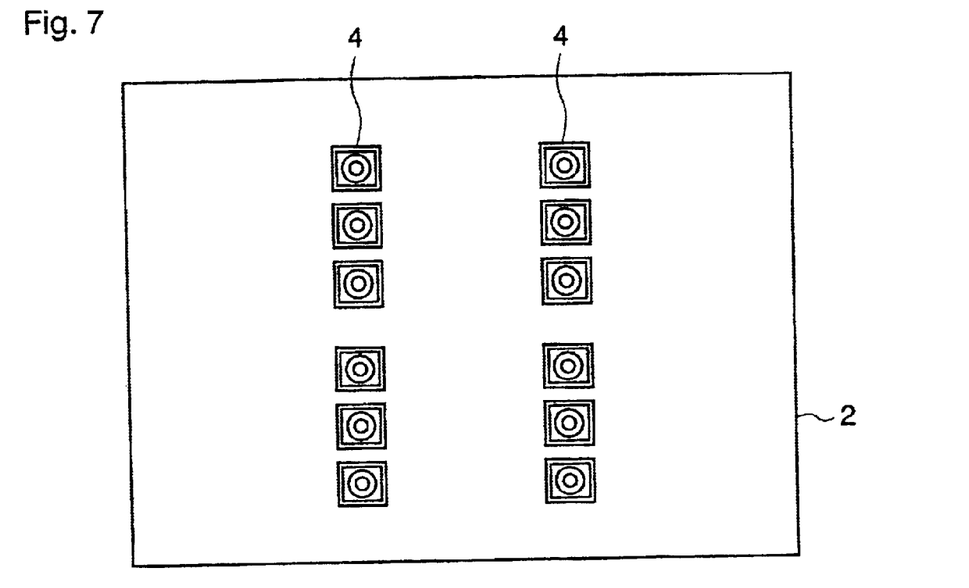
FIG. 7 is a structural diagram showing another embodiment of the present invention.

FIG. 7 is a plan view illustrating the structure of a quartz crystal oscillator of another embodiment of the present invention.

This quartz crystal oscillator has a structure in which a plurality of bumps 4 are formed at regular intervals on the center portion of the active element surface of the IC chip 2.

By employing this structure, the stress applied to the bumps 4 can be evenly distributed and a disconnection failure of the bump 4 and the electrode pattern 3 is eliminated. Also by employing this structure, the bonding process using ultrasonic waves is carried out in a well-balanced manner, and failure such as the IC chip 2 being mounted in a slanted manner is eliminated.

Embodiment 3

Figure 8:
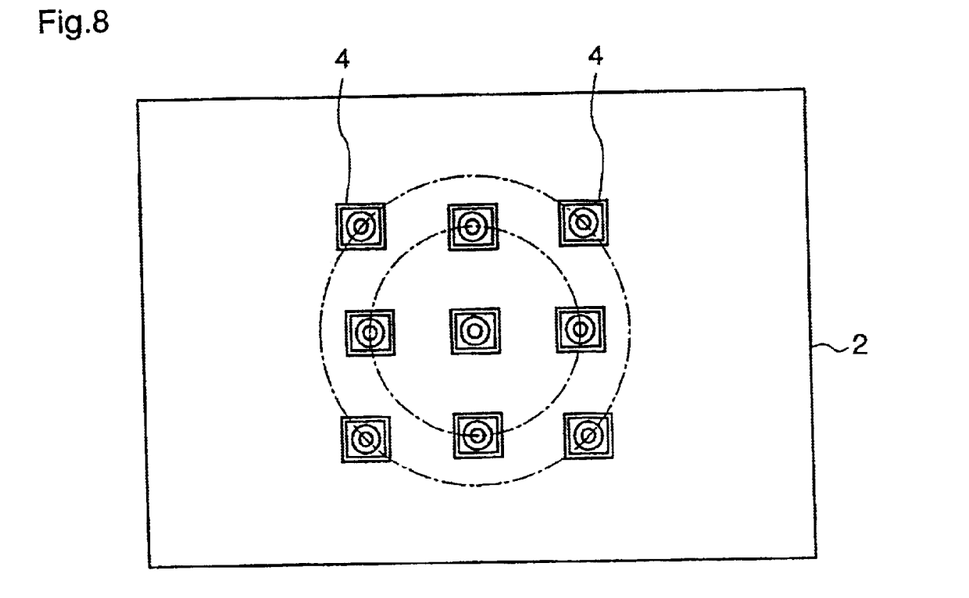
FIG. 8 is a structural diagram showing another embodiment of the present invention.

FIG. 8 is a plan view illustrating the structure of a quartz crystal oscillator according to yet another embodiment of the present invention.

This quartz crystal oscillator has a structure in which a plurality of bumps 4 formed on the IC chip 2 are concentrically formed about the center of the active element surface of the IC chip 2.

As in Embodiment 2, the stress applied to the bumps 4 can be evenly distributed, and a disconnection failure of the bump 4 and the electrode pattern 3 is eliminated. Also, the bonding process using ultrasonic waves is carried out in a well-balanced manner, and failure such as the IC chip 2 being mounted in a slanted manner is eliminated.

Embodiment 4

Figure 9:
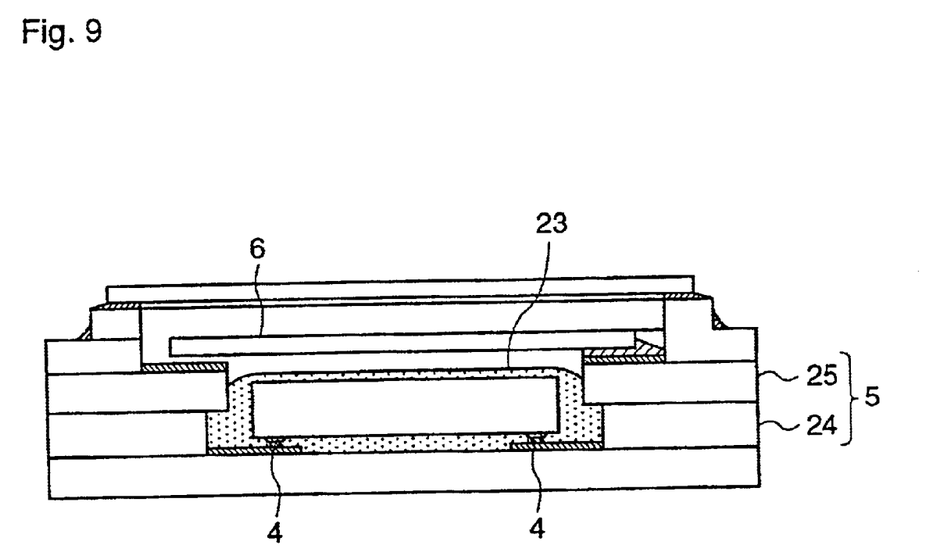
FIG. 9 is a structural diagram showing another embodiment of the present invention.

FIG. 9 is a structural diagram showing the structure of a quartz crystal oscillator according to still another embodiment of the present invention.

In this quartz crystal oscillator, an underfill material 23 is applied so as to cover the rear surface of the IC chip 2. This underfill material 23 not only enhances the reliability of the bonding, but also serves to radiate heat from the IC chip 2 by improving thermal conductivity.

Furthermore, in order for theunderfill material 23 to property permeate to the bonded portion of the bumps 4, the second layer 5 on which the AT-cut quartz crystal resonator 6 is mounted may include two layers, i.e., a first layer 24 and a second layer 25. The opening portion of the first layer 24 is formed to be larger than the opening portion of the second layer 25. By forming the second layer 25 in such a manner, the underfill material 23 properly permeates to the bonded portion of the bumps 4 and a highly reliable bonding structure is obtained.

Figure 10:
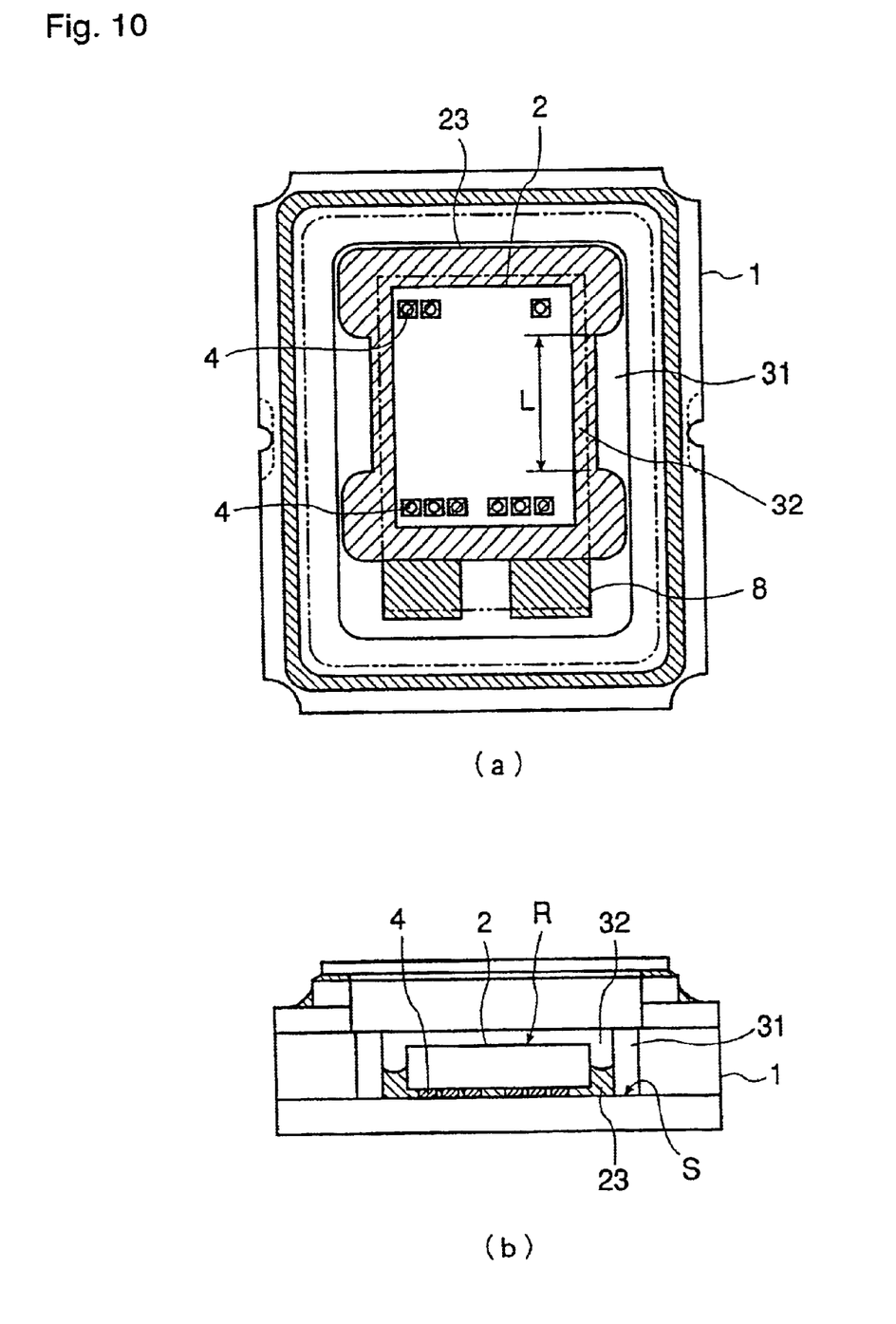
FIGS. 10(A)–(B) are a plan view and a front view, respectively, showing another embodiment of the present invention.

FIGS. 10(A) and 10(B) are structural diagrams showing the structure of a quartz crystal oscillator according to yet another embodiment of the present invention.

As shown in FIG. 10(A), in this quartz crystal oscillator, for example, protrusions 31 are formed in the side walls of the base 1 which face the two sides along the longitudinal direction of the IC chip 2. A gap 32 between the IC chip 2 and the protrusion 31 is set to be 0.05 to 0.15 mm, for example. In this embodiment, the gap 32 is set to 0.15 mm, for example.

As in Embodiment 1, on the electrode pad of the IC chip 2, the bump 4 made of metal such as Au is formed and is connected by the flip-chip bonding process to the electrode pattern 3 formed on the base 1.

Figure 11:
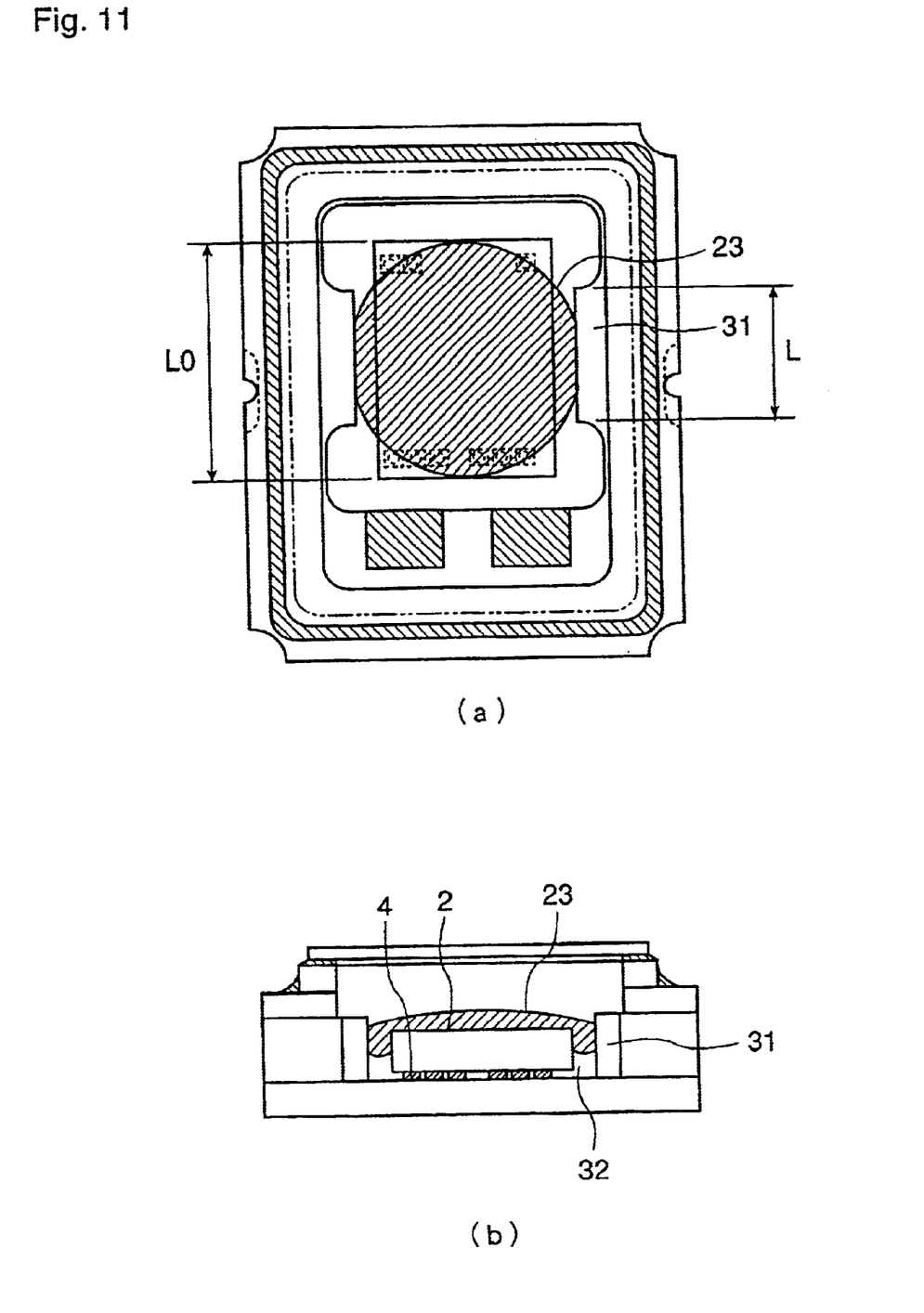
FIGS. 11(A)–(B) are a plan view and a front view, respectively, showing another embodiment of the present invention.

Next, the method for applying the underfill material 23 on the rear surface of the IC chip 2 so that the underfill material 23 completely fills, without gap, the portion of the IC chip 2 in which the bumps 4 are provided, as shown in FIGS. 11(A) and 11(B), will be explained in detail.

The underfill material 23 applied to the IC chip 2 through an applicator such as a dispenser, only spreads over the rear surface of the IC chip 2 due to surface tension, as shown in FIG. 11(B), and is prevented from flowing to the region with the bumps 4.

Then, as shown in FIG. 11(A), the protrusions 31 are formed on the side walls of the base 1 facing the two sides along the longitudinal direction of the IC chip 2. Because of these, the underfill material 23 applied through the applicator such as the dispenser contacts the protrusions 31 at the peripheral portion thereof, and spreads. The underfill material 23 permeates the gap 32 between the IC chip 2 and the protrusions 31, and completely fills the portion of the IC chip 2 provided with the bumps 4, without gaps.

Here, a width L of the protrusions 31 is set to ⅓ to ½ of the width L0 of the IC chip 2. By so setting the dimension of the width of the protrusion 31, the underfill material 23 is prevented from overflowing the mounting portion 8, etc. It also serves to urge the underfill material 23 to spread to the region of the IC chip 2 provided with the bump 4.

As shown in FIG. 10(B), the protrusions 31 are formed to be higher than the rear surface R of the IC chip 2 and are formed down to the bonding surface S of the base 1 to which the bumps 4 are connected. By thus forming the protrusions 31, the underfill material 23 is prevented from spreading upward along the side wall of the base 1 and from spreading toward the mounting portion 8 of the AT-cut quartz crystal resonator 6. Formation of the protrusions 31 also serves to urge the underfill material 23 to spread to the bonding surface of the base 1.

The gap 32 only needs to be wider than the particles of the underfill material 23, and, ideally, 0.05 mm is optimum from various permeation characteristic experiments concerning the underfill material 23.

Figure 12:
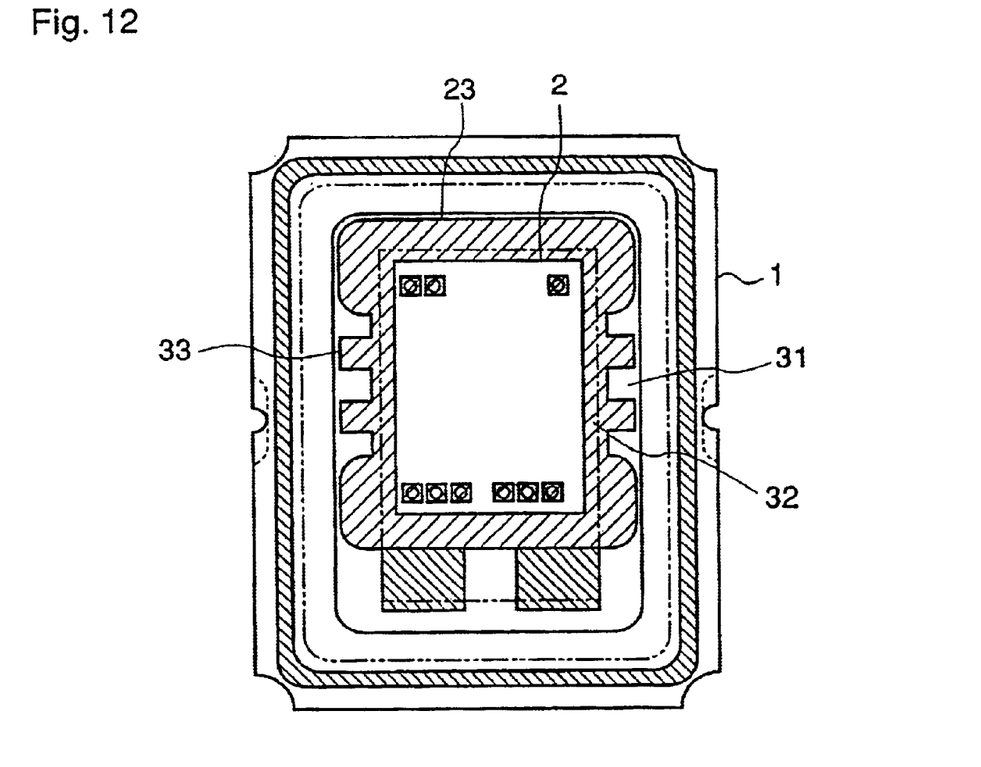
FIG. 12 is a structural diagram showing another embodiment of the present invention.

The protrusion 31 may be shaped to have recesses 33, as shown in FIG. 12.

Consequently, as shown in FIG. 10(B), the underfill material 23 completely fills the gap provided at the portion of the IC chip 2 having the bumps 4, and covers the vicinity of the bumps 4.

The underfill material 23 not only enhances the reliability of the bonding, but also serves to radiate the heat from the IC chip 2 by improving thermal conductivity.

As in the above, by using highly reliable and inexpensive components such as ceramic and metal, a thin and small, for example, 2 to 3.2 mm in length, 2 to 2.5 mm in width, and 0.7 to 1.0 mm in thickness, piezoelectric oscillator of high reliability can be provided at reduced cost.

Embodiment 6

Figure 14:
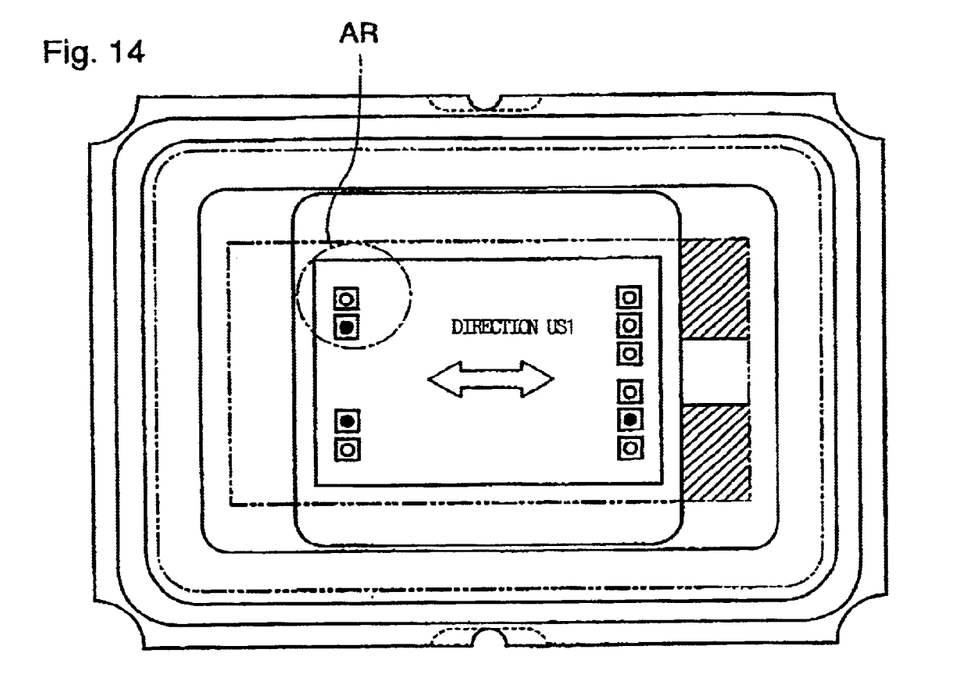
FIG. 14 is a structural diagram showing yet another embodiment of the quartz crystal oscillator of the present invention.
Figure 15:
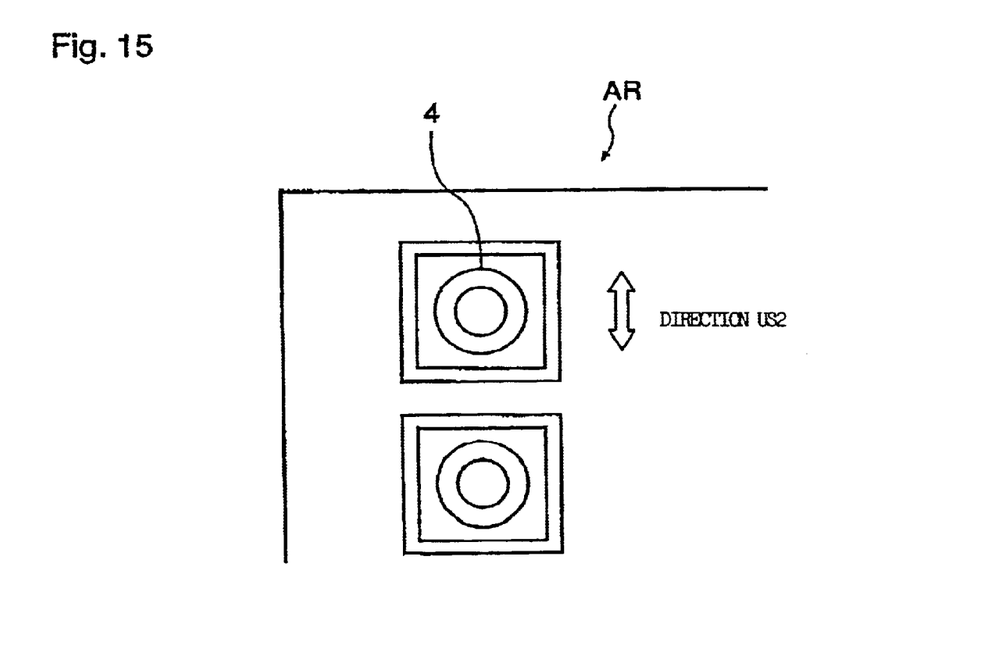
FIG. 15 is an enlarged plan view showing a structure of a portion AR in FIG. 14.

FIG. 14 is a structural diagram illustrating the structure of a quartz crystal oscillator according to yet another embodiment of the present invention; and FIG. 15 is an enlarged plan view showing a structure of a portion AR in FIG. 14.

During the process for forming the bumps, as shown in FIG. 2, the plurality of bumps 4 are formed on the pads 14 of the wafer IC chip 2 which is, for example, 4 to 6 inches by ultrasonic bump bonding using fine Au bonding lines each having a diameter of, for example, approximately 25 to 35 μm.

During the flip chip bonding process (FCB process), as shown in the process diagram of the flip-chip bonding process in FIG. 5, the wafer IC chip 2 is picked up by a nozzle such as an inverted pyramidal collet or the like, is turned over, and is passed on to an nozzle tip of an ultrasonic horn. Then, the IC chip 2 is aligned and is chip-mounted on a mounting area of the base 1 with high precision by a system such as an image recognition system provided in the flip chip bonding apparatus.

Since the pad 14 provided with the bump 4 is, as in above, loaded several times with weight and ultrasonic waves, it is possible that the pad 14 suffers from damage. However, this embodiment prevents such damage in a manner described below.

In this embodiment, the vibration direction US2 of the ultrasonic waves for ultrasonic bonding and for forming bumps on the IC chip 2 shown in FIG. 15, and vibration direction US1 of the ultrasonic waves for performing a ultrasonic bonding of the IC chip 2 and the base 1 shown in FIG. 14 are set to be different, preferably, in directions which differ from one another by 90 degrees.

By setting the vibration direction US1 and the vibration direction US2 differently, damage to the pad 14 due to repetitively applying a load by ultrasonic waves can be prevented.

The present invention is not limited to the above-described embodiments, and various modifications are possible without departing from the scope of the claims.

For example, although the description has been made with regard to a quartz crystal oscillator in which a single-chip-type semiconductor integrated circuit having an oscillating circuit is used and in which an AT-cut quartz crystal resonator element is used as a piezoelectric resonator element, the present invention is not limited to this. For example, the present invention can be applied to any piezoelectric device having a semiconductor integrated circuit such as a voltage-controlled oscillator (VCXO), a temperature-compensated oscillator (TCXO), a SAW oscillator, real time clock modules. Furthermore, the present invention is also applicable to a piezoelectric device in which a quartz crystal resonator chip or a SAW chip is mounted in a package by flip-chip bonding.

As described above, according to the present invention, because of the structure in which an opening is formed in the center of the base provided with an input/output electrode pattern, a semiconductor integrated circuit is mounted in the center of the opening, and the semiconductor integrated circuit is connected by a plurality of bumps to the electrode pattern on the base, the stress is evenly distributed over the semiconductor integrated circuit and stress concentration at a specific bump can be eliminated. Accordingly, a piezoelectric oscillator of superior configuration which is free of jointing failure between the bump and the electrode pattern can be provided.

According to the present invention, because of the structure in which dummy bumps are formed on the active element surface of the semiconductor integrated circuit, and the dummy bumps of the semiconductor integrated circuit are connected to the electrode pattern on the base, the stress applied to the bumps can be evenly distributed. Also, a bonding process using ultrasonic waves can be carried out in a well-balanced manner, the semiconductor integrated circuit is prevented from being mounted in an angled manner, and a piezoelectric oscillator of high quality can be provided.

Furthermore, according to the present invention, by filling an underfill material around the semiconductor integrated circuit so as to cover the entire semiconductor integrated circuit, i.e., including the rear surface of the semiconductor integrated circuit, is not only the reliability of bonding between the semiconductor integrated circuit and the base enhanced, but also heat from the semiconductor integrated circuit can be conducted through the underfill material and can be radiated to the outside of the package.

According to the present invention, by regulating the vibration direction of ultrasonic waves applied to the semiconductor integrated circuit, short-circuits between adjacent bumps can be prevented, ultrasonic bonding can be carried out securely, i.e., bonding between every bump and electrode pattern can be performed in an even manner, and a high quality piezoelectric oscillator with a superior yield can be provided.

According to the present invention, by shaping each of a plurality of bumps on the semiconductor integrated circuit to have two levels, for example, one formed to be 80 to 90 μm in diameter and 30 to 35 μm in height, and the other formed to be 40 to 45 μm in diameter and 30 to 35 μm in height, the gap between the semiconductor integrated circuit and the base can be maintained to be several tens of μm (approximately 30 μm), thereby performing ultrasonic bonding in a stable manner, i.e., without experiencing short circuits, bonding shear, or the like.

According to the present invention, because a protrusion is formed in at least one side wall of the base opposing a side of the semiconductor integrated circuit, the underfill material applied through an applicator such as a dispenser can completely fill the gap which is a region of the semiconductor integrated circuit around the bumps, and the bump portion can be securely coated with the underfill material. Also, by this structure, it becomes possible to apply a little underfill material, thereby preventing the underfill material from contacting to an AT-cut quartz crystal resonator, etc., and avoiding inconveniences such as oscillation termination, and variation in oscillation frequency.

According to the present invention, by setting the vibration direction of ultrasonic waves for ultrasonic bonding and for forming the bumps on the semiconductor integrated circuit and the vibration direction of ultrasonic waves for performing ultrasonic bonding of the semiconductor integrated circuit and a package differently, damage due to repetitively applying a load by the ultrasonic waves can be prevented.

INDUSTRIAL APPLICABILITY

As described above, the present invention is suitable when used as a piezoelectric device having a package including a semiconductor integrated circuit and a piezoelectric resonator element and as a method for manufacturing the same.

What is claimed is:
1. A piezoelectric device, comprising:
a semiconductor integrated circuit; and
a piezoelectric resonator element, the semiconductor integrated circuit and the piezoelectric resonator element being included in a package,
a plurality of bumps being formed at two opposing sides of an active element surface of the semiconductor integrated circuit, the semiconductor integrated circuit being mounted in a center of an opening formed in a center of a base, and the semiconductor integrated circuit being connected to an input/output electrode pattern through the plurality of bumps by ultrasonic bonding, each of the plurality of bumps formed on the semiconductor integrated circuit being shaped to have two levels, a first level having a diameter 0.8 to 0.9 times and a second level having a diameter 0.4 to 0.45 times the length of an opening in a pad provided on the active element surface of the semiconductor integrated circuit.

2. The piezoelectric device according to claim 1, wherein the base includes a layered part, which surrounds the semiconductor integrated circuit, for mounting the piezoelectric resonator element, the layered part comprising at least two layers, including a first layer and a second layer, the first layer being below the second layer, wherein an opening of the first layer is formed to he larger than an opening of the second layer.

3. The piezoelectric device according to claim 1, the plurality of bumps formed on the semiconductor integrated circuit being formed at regular intervals on a center portion of an active element surface of the semiconductor integrated circuit.

4. The piezoelectric device according to claim 1, the plurality of bumps formed on the semiconductor integrated circuit being concentrically formed about a center of an active element surface of the semiconductor integrated circuit.

5. The piezoelectric device according to claim 1, further comprising a dummy bump formed on an active element surface of the semiconductor integrated circuit.

6. The piezoelectric device according to claim 5, the dummy bump formed on the semiconductor integrated circuit being connected to the electrode pattern on the base.

7. The piezoelectric device according to claim 1,
a protrusion being formed in at least one side wall of the base facing the side of the semiconductor integrated circuit and protruding into the opening to form the protrusion.

8. The piezoelectric device according to claim 7, the protrusion being formed in each of side walls of the base facing two sides along the longitudinal direction of the semiconductor integrated circuit.

9. The piezoelectric device according to claim 7, the protrusion formed in the side wall of the base having a substantially same height as, or is higher than, the semiconductor integrated circuit.

10. The piezoelectric device according to claim 7, wherein a gap between the protrusion formed in the side wall of the base and the semiconductor integrated circuit being set to a range between 0.05 and 0.15 mm.

11. The piezoelectric device according to claim 1, a vibration direction of ultrasonic waves applied to the semiconductor integrated circuit being perpendicular to two opposing sides of the active element surface of the semiconductor integrated circuit at which the plurality of bumps are formed.

12. The piezoelectric device according to claim 1, a printing direction of the electrode pattern on the base being the same as a vibration direction of ultrasonic waves applied to the semiconductor integrated circuit.

13. The piezoelectric device according to claim 1, wherein the first level is 80 to 90 μm in diameter and 30 to 35 μm in height, and the second level is 40 to 45 μm in diameter and 30 to 35 μm in height.

14. The piezoelectric device according to claim 1, the base comprising a ceramic composite substrate.

15. The piezoelectric device according to claim 1, the plurality of bumps formed on the semiconductor integrated circuit being Au bumps.

16. The piezoelectric device according to claim 1, a longitudinal direction of the electrode pattern on the base being the same as a vibration direction of ultrasonic waves applied to the semiconductor integrated circuit.

17. The piezoelectric device according to claim 1,
a vibration direction of ultrasonic waves for ultrasonic bonding and for forming bumps on the semiconductor integrated circuit being different from a vibration direction of ultrasonic waves for performing ultrasonic bonding of the semiconductor integrated circuit to the package.

18. The piezoelectric device according to claim 7, wherein a gap is defined between the protrusion and the semiconductor integrated circuit in that the protrusion does not contact the semiconductor integrated circuit.

19. The piezoelectric device according to claim 18, wherein an underfill material permeates the gap and fills a portion of the integrated circuit having the plurality of bumps.

20. The piezoelectric device according to claim 1, wherein an underfill material permeates to the first layer and fills a portion of the integrated circuit having the plurality of bumps.

* * * * *